United States Patent
Arakawa

(10) Patent No.: US 6,859,400 B2
(45) Date of Patent: Feb. 22, 2005

(54) SEMICONDUCTOR MEMORY DEVICE

(75) Inventor: Tomofumi Arakawa, Kanagawa (JP)

(73) Assignee: Sony Corporation, Tokyo (JP)

( * ) Notice: Subject to any disclaimer, the term of this patent is extended or adjusted under 35 U.S.C. 154(b) by 41 days.

(21) Appl. No.: 10/356,482

(22) Filed: Feb. 3, 2003

(65) Prior Publication Data

US 2003/0179620 A1 Sep. 25, 2003

(30) Foreign Application Priority Data

Feb. 7, 2002 (JP) .................................... P2002-030593

(51) Int. Cl.⁷ ............................................... G11C 7/00
(52) U.S. Cl. .................. 365/189.05; 365/233; 365/205
(58) Field of Search .......................... 365/189.05, 233, 365/205, 222

(56) References Cited

U.S. PATENT DOCUMENTS

| 6,215,706 B1 | * | 4/2001 | Harrand et al. ......... 365/189.05 |
| 6,215,726 B1 | * | 4/2001 | Kubo ......................... 365/233 |
| 2002/0021609 A1 | * | 2/2002 | Kitamoto et al. .......... 365/222 |

* cited by examiner

*Primary Examiner*—Huan Hoang
(74) *Attorney, Agent, or Firm*—Rader, Fishman & Grauer PLLC; Ronald P. Kananen

(57) ABSTRACT

The present invention provides a semiconductor memory device comprising: a memory cell; a sense amplifier for amplifying data read out from the memory cell; and a first to a third latch circuit connected in parallel with the sense amplifier.

13 Claims, 12 Drawing Sheets

F I G. 1
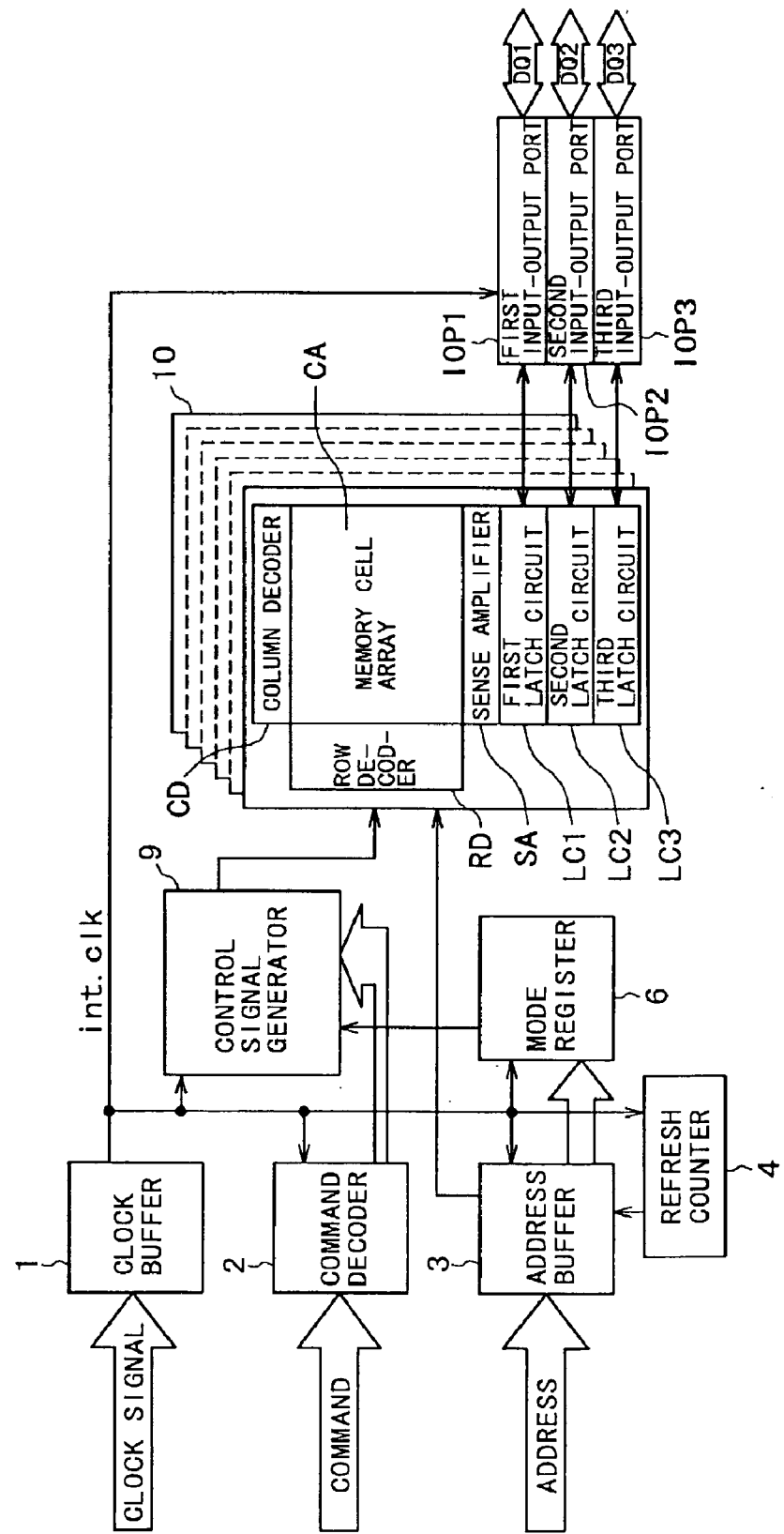

FIG. 5A  CLK
FIG. 5B  COMMAND
FIG. 5C  ROW ADDRESS
FIG. 5D  COLUMN ADDRESS
FIG. 5E  WL
FIG. 5F  SAH
FIG. 5G  SAL
FIG. 5H  BL/BL
FIG. 5I  ST1
FIG. 5J  FIRST LATCH CIRCUIT
FIG. 5K  INPUT DATA
FIG. 5L  FIRST INPUT-OUTPUT PORT
FIG. 5M  YW0

SEMICONDUCTOR MEMORY DEVICE

BACKGROUND OF THE INVENTION

The present invention relates to a semiconductor memory device.

FIG. 11 is a block diagram showing a general configuration of a conventional synchronous-type semiconductor memory device (SDRAM). As shown in FIG. 11, the conventional synchronous-type semiconductor memory device includes: a clock buffer 1; a command decoder 2; an address buffer 3; a refresh counter 4; a control signal generator 5; a mode register 6; a memory unit 7; and a DQ buffer 8. The memory unit 7 includes: a memory cell array CA; a column decoder CD; a row decoder RD; and a sense amplifier SA.

The synchronous-type semiconductor memory device having the configuration as described above operates in response to a clock signal, a command, and an address supplied externally. More specifically, the synchronous-type semiconductor memory device reads out and writes data from and to the memory cell array CA via the DQ buffer 8 in synchronism with an internal clock signal int.clk generated on the basis of the clock signal.

FIG. 12 is a block diagram showing a configuration of a data latch unit 15 included in the memory unit 7 of the synchronous-type semiconductor memory device shown in FIG. 11. FIG. 12 also shows: the memory cell array CA formed with a memory cell MC connected to a bit line BL or a complementary bit line /BL; the sense amplifier SA; a reading and writing gate RWG connected in parallel with the sense amplifier SA between the bit line pair; and an input-output port IOP formed by a reading and writing bus connected to the reading and writing gate RWG.

As shown in FIG. 12, the conventional data latch unit 15 is connected in series with the sense amplifier SA via a gate G, and includes a latch circuit LC and a reading gate RG. An output port OP is connected to the reading gate RG.

In the conventional synchronous-type semiconductor memory device having the configuration as described above, read data amplified by the sense amplifier SA are transferred to the latch circuit LC via the gate G and then stored in the latch circuit LC. Thus, even after other data is read out from the memory cell array CA, the data stored in the latch circuit LC can be read independently.

However, when read data is transferred to the latch circuit LC as described above, the read data always need to be amplified by the sense amplifier SA. Therefore, access to the memory cell array CA is interrupted, and data outputted to the sense amplifier SA is destroyed. Thus, when the data outputted to the sense amplifier SA are desired to be used, the data needs to be outputted to the sense amplifier SA again after completion of the operation of transfer to the latch circuit LC. Furthermore, new access to the memory cell array CA during this period is impossible. Therefore, the efficiency of read data output is greatly decreased.

In other words, the operation of reading data from the memory cell array CA and the operation of data transfer to the latch circuit LC are not completely independent of each other; therefore when the transfer operation is given higher priority, efficient reading operation cannot be performed, whereas when the efficient reading operation is given higher priority, the transfer to the latch circuit LC cannot be effected.

SUMMARY OF THE INVENTION

The present invention has been made to solve the problems as described above, and it is accordingly an object of the present invention to provide a semiconductor memory device that increases the speed and efficiency of data processing.

The object of the present invention is achieved by providing a semiconductor memory device comprising: a memory cell; amplifying means for amplifying data read out from the memory cell; and a plurality of memory means connected in parallel with the amplifying means.

With such means, since the plurality of memory means are connected in parallel with the amplifying means, memory means other than memory means to which the data amplified by the amplifying means is transferred can be accessed regardless of operation of the amplifying means.

The semiconductor memory device in this case further comprises data input and output means connected to at least two of the plurality of memory means, for selectively inputting and outputting data between at least the two of the plurality of memory means and an exterior of the semiconductor memory device. Thus, a multiport semiconductor memory device on a reduced circuit scale can be obtained.

The semiconductor memory device further comprises a bit line and a complementary bit line connected to the memory cell and the amplifying means. When each of the plurality of memory means is connected to the bit line and the complementary bit line, it is possible to increase the speed of reading and writing data from and to the memory means and increase reliability of data stored in the memory means.

BRIEF DESCRIPTION OF THE DRAWINGS

FIG. 1 is a block diagram showing a general configuration of a synchronous-type semiconductor memory device according to a first embodiment of the present invention;

DETAILED DESCRIPTION OF PREFERRED EMBODIMENTS

Figure 2:
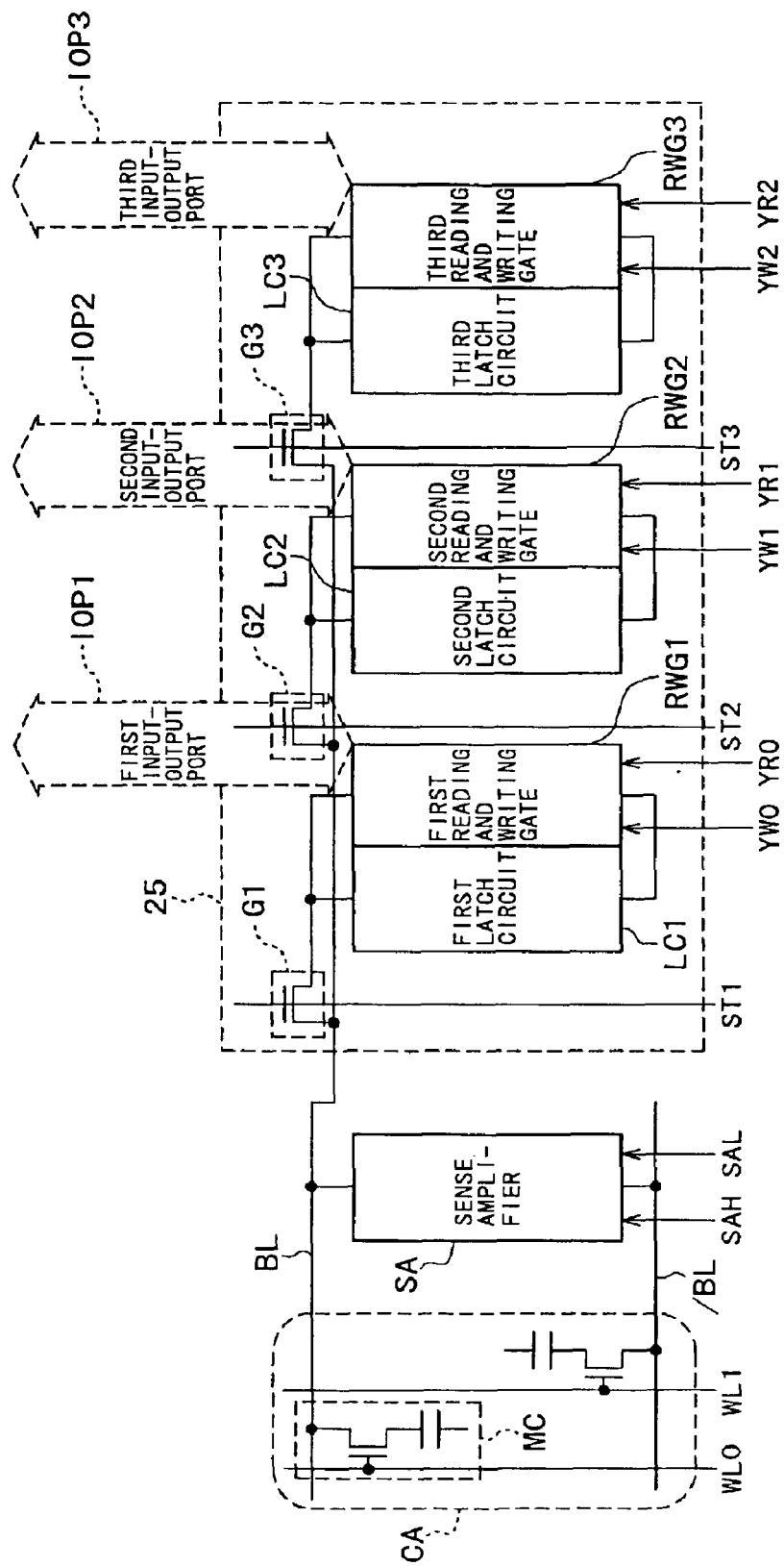
FIG. 2 is a block diagram showing a configuration of a data latch unit included in the synchronous-type semiconductor memory device shown in FIG. 1.

Preferred embodiments of the present invention will hereinafter be described in detail with reference to the drawings. The same reference numerals in the drawings denote the same or corresponding parts.

[First Embodiment]

FIG. 1 is a block diagram showing a general configuration of a synchronous-type semiconductor memory device according to a first embodiment of the present invention. As shown in FIG. 1, the synchronous-type semiconductor memory device according to the first embodiment of the present invention includes: a clock buffer 1; a command decoder 2; an address buffer 3; a refresh counter 4; a mode register 6; a control signal generator 9; a memory unit 10; and a first to a third input-output port IOP1 to IOP3. The memory unit 10 includes a memory cell array CA formed by dynamic random access memory (DRAM), a column decoder CD, a row decoder RD, a sense amplifier SA, and a first to a third latch circuit LC1 to LC3.

The clock buffer 1 generates an internal clock signal int.clk in response to a clock signal supplied thereto externally, and then supplies the internal clock signal int.clk to the command decoder 2, the address buffer 3, the refresh counter 4, the mode register 6, the control signal generator 9, and the first to the third input-output port IOP1 to IOP3.

The command decoder 2 is supplied with a command. The address buffer 3 is supplied with an address (a row address and a column address). The refresh counter 4 generates an internal address during refresh operation, and supplies the internal address to the address buffer 3. The mode register 6 is connected to the address buffer 3. The control signal generator 9 generates an internal control signal in response to a command supplied from the command decoder 2. The memory unit 10 is connected to the address buffer 3 and the control signal generator 9. The first input-output port IOP1 is connected to the first latch circuit LC1; the second input-output port IOP2 is connected to the second latch circuit LC2; and the third input-output port IOP3 is connected to the third latch circuit LC3.

In the synchronous-type semiconductor memory device having the above configuration, the memory unit 10 is controlled by an internal control signal generated by the control signal generator 9, and a memory cell specified by an address supplied to the address buffer 3 is accessed. The first to third input-output ports IOP1 to IOP3 input and output data DQ1 to DQ3 in synchronism with the internal clock signal int.clk.

FIG. 2 is a block diagram showing a configuration of a data latch unit 25 included in the synchronous-type semiconductor memory device shown in FIG. 1. As shown in FIG. 2, the data latch unit 25 is connected in parallel with the sense amplifier SA, and includes a first to a third latch circuit LC1 to LC3. The first to third latch circuits LC1 to LC3 are connected in parallel with the sense amplifier SA. Specifically, the first latch circuit LC1 is connected to a bit line BL via a gate G1 formed by an N-channel MOS transistor; the second latch circuit LC2 is connected to the bit line BL via a gate G2 formed by an N-channel MOS transistor; and the third latch circuit LC3 is connected to the bit line BL via a gate G3 formed by an N-channel MOS transistor.

Further, a first reading and writing gate RWG1 is connected in parallel with the first latch circuit LC1; a second reading and writing gate RWG2 is connected in parallel with the second latch circuit LC2; and a third reading and writing gate RWG3 is connected in parallel with the third latch circuit LC3.

Further, the first input-output port IOP1 is connected to the first latch circuit LC1 via the first reading and writing gate RWG1; the second input-output port IOP2 is connected to the second latch circuit LC2 via the second reading and writing gate RWG2; and the third input-output port IOP3 is connected to the third latch circuit LC3 via the third reading and writing gate RWG3.

Figure 3:
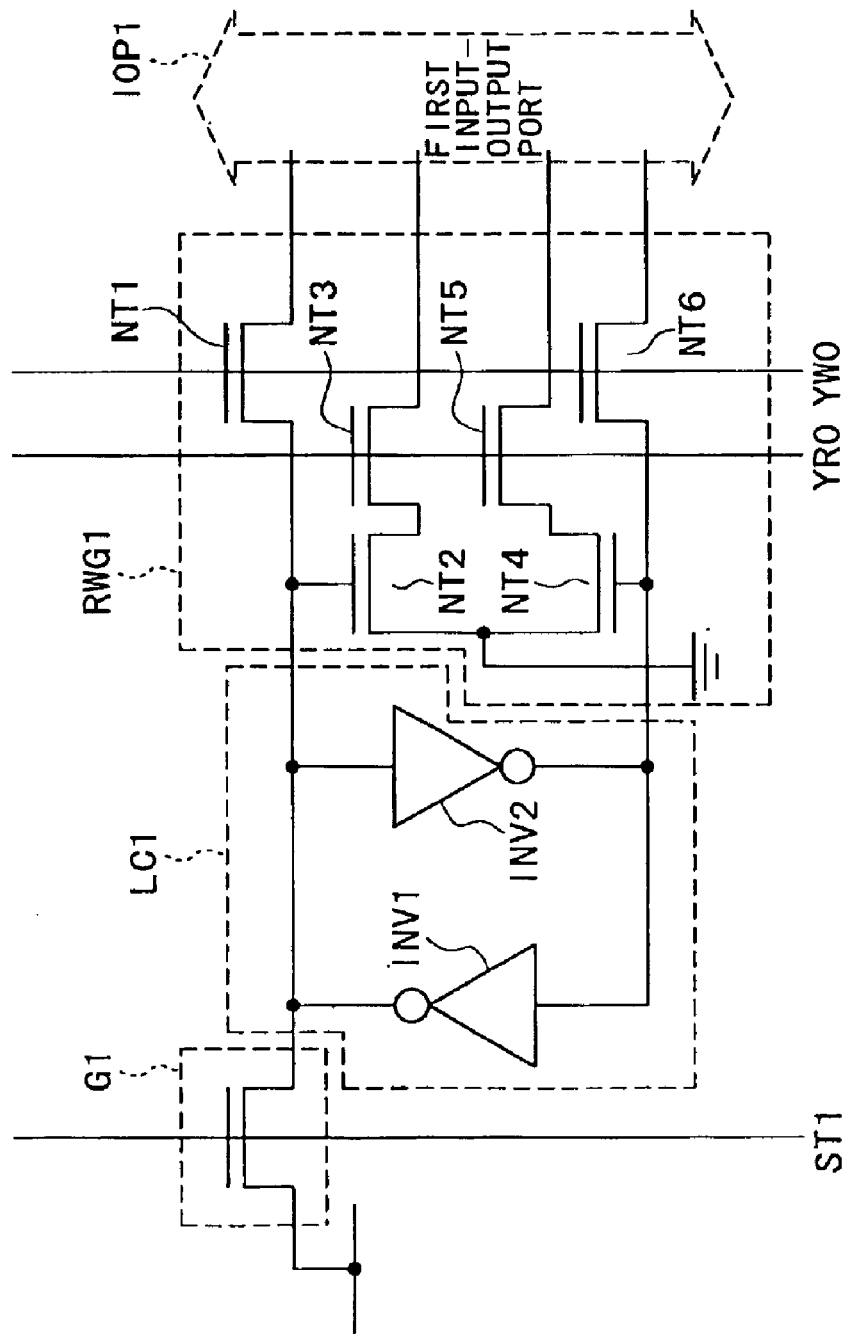
FIG. 3 is a circuit diagram showing components of the data latch unit shown in FIG. 2.

FIG. 3 is a circuit diagram of assistance in explaining components of the data latch unit 25 shown in FIG. 2. It is to be noted that while FIG. 3 shows only components corresponding to the first latch circuit LC1, the data latch unit 25 includes similar components in correspondence with each of the second latch circuit LC2 and the third latch circuit LC3.

As shown in FIG. 3, the first latch circuit LC1 includes two inverters INV1 and INV2, and the first reading and writing gate RWG1 includes N-channel MOS transistors NT1 to NT6. Gates of the N-channel MOS transistors NT3 and NT5 are supplied with a signal YR0, whereas gates of the N-channel MOS transistors NT1 and NT6 are supplied with a signal YW0.

Operation of the synchronous-type semiconductor memory device having the above configuration according to the first embodiment will be described in the following. First, an operation of outputting data stored in a memory cell to the first and second input-output ports IOP1 and IOP2 in response to a command supplied to the command decoder will be described with reference to FIGS. 4A to 4Q.

Figure 4:
FIGS. 4A to 4Q are timing charts of data reading operation of the synchronous-type semiconductor memory device shown in FIG. 1.

When a command ACT0 is supplied to the command decoder 2 and a row address RA0 is supplied to the address buffer 3 at a time T1 as shown in FIGS. 4B and 4C, a word line WL0 is activated to a high level (H) and data stored in the memory cell is outputted to the bit line pair BL and /BL, as shown in FIGS. 4E and 4I.

As shown in FIGS. 4G, 4H, and 4I, sense amplifier starting signals SAH and SAL are activated, whereby the data outputted to the bit line pair BL and /BL is amplified. At this time, as shown in FIG. 4J, a transfer signal ST1 is activated to a high level (H), whereby the gate G1 is opened. Thus, as shown in FIG. 4K, the data amplified by the sense amplifier SA is transferred to the first latch circuit LC1. Then the transfer signal ST1 is deactivated to a low level (L), whereby the gate G1 is closed. The bit line pair BL and /BL and the first latch circuit LC1 are electrically disconnected from each other.

Thus, the bit line pair BL and /BL returns to a standby state. Further, in the example shown in FIGS. 4A to 4Q, a command ACT1 is supplied to the command decoder 2 and a row address RA1 is supplied to the address buffer 3 at a time T7. Thereby, as shown in FIGS. 4F, 4I, and 4M, as a result of a similar operation to that described above, data stored in a memory cell connected to a word line WL1 is amplified and then transferred to the second latch circuit LC2 via the gate G2. Then, as shown in FIG. 4L, a transfer signal ST2 is deactivated to a low level (L), whereby the gate G2 is closed. The bit line pair BL and /BL and the second latch circuit LC2 are electrically disconnected from each other.

In a period in which the data is transferred to the second latch circuit LC2 as described above, the data transfer to the first latch circuit LC1 is completed, and, therefore the data stored in the first latch circuit LC1 can be read. For example, when a read command RD0 is supplied to the command decoder 2 and a column address CA0 is supplied to the address buffer 3 at a time T9, as shown in FIGS. 4A and 4D, a signal YR0 is activated to a high level as shown in FIG. 4N, and data D0 stored in the first latch circuit LC1 is read via the first input-output port IOP1 as shown in FIGS. 4K and 4O. Thus, it is possible to read data from a latch circuit where the data transfer is already completed, irrespective of and independently of the operation of reading data from the memory cell array CA.

FIGS. 4B, 4D, 4M, 4P, and 4Q show an operation of supplying a read command RD1 to the command decoder 2 and a column address CA1 to the address buffer 3 at a time T13 after the completion of the data transfer to the second latch circuit LC2 and thereby reading data D1 stored in the second latch circuit LC2 via the second input-output port IOP2.

Figure 5:
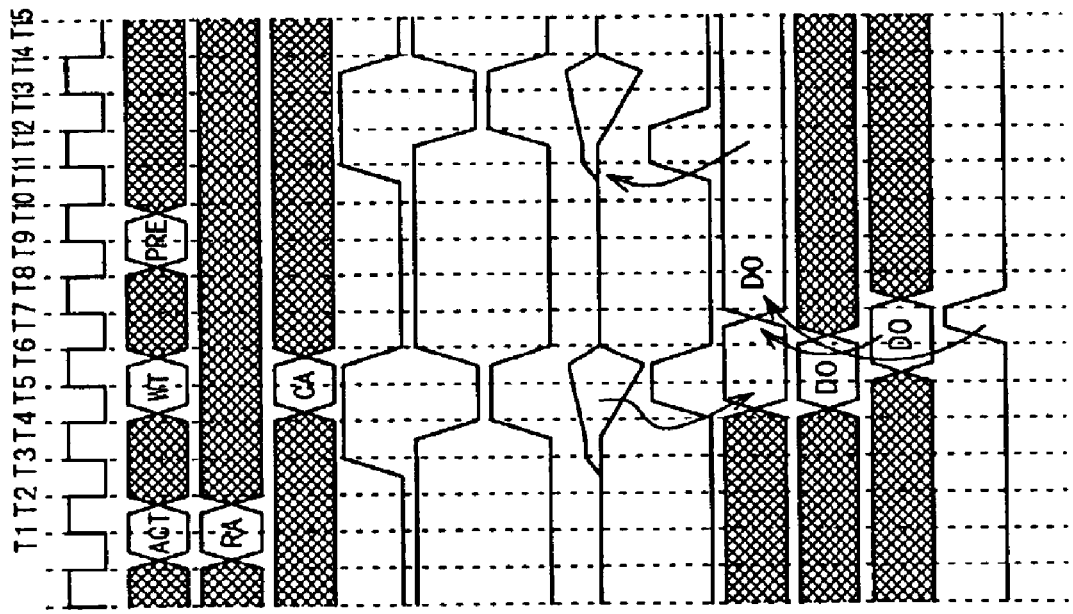
FIGS. 5A to 5M are timing charts of normal writing operation of the synchronous-type semiconductor memory device shown in FIG. 1.
Figure 6:
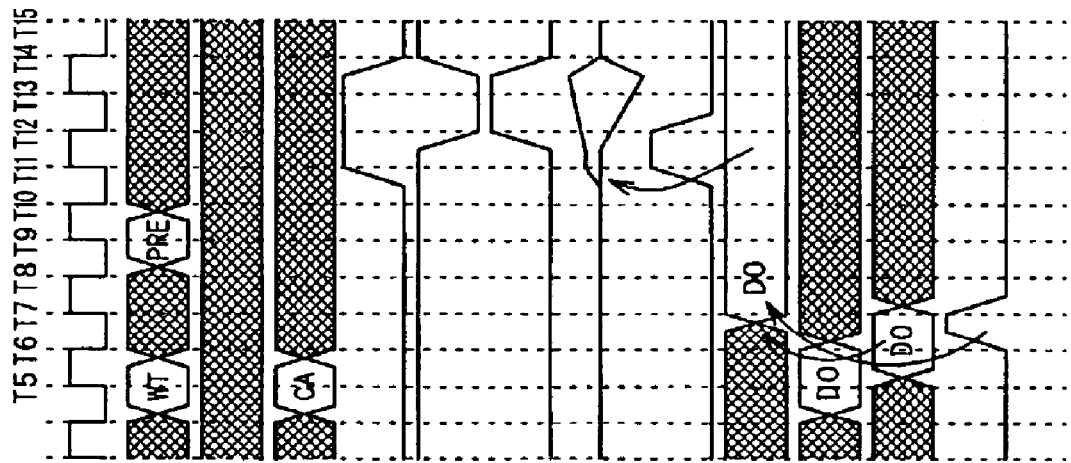
FIGS. 6A to 6M are timing charts of operation when the synchronous-type semiconductor memory device shown in FIG. 1 writes only to a first latch circuit.

Normal writing operation will next be described with reference to FIGS. 5A to 5M. First, as shown in FIGS. 5B and 5C, at a time T1, a command ACT is supplied to the command decoder 2 and a row address RA is supplied to the address buffer 3, whereby the memory unit 10 is activated. Then, as shown in FIGS. 5B and 5D, when a write command WT is supplied to the command decoder 2 and a column address CA is supplied to the address buffer 3 at a time T5, a signal YW0 is activated to a high level, and thereby input data D0 is written to the first latch circuit LC1 via the first input-output port IOP1 and the first reading and writing gate RWG1, as shown in FIGS. 5J to 5M.

When a precharge command PRE is thereafter inputted to the command decoder 2 at a time T9 as shown in FIG. 5B, the input data D0 stored in the first latch circuit LC1 is outputted to the bit line pair BL and /BL as shown in FIGS. 5H and 5J. Thus, the input data D0 is written to a memory cell forming the memory cell array CA.

When data is to be written only to the first latch circuit LC1 in the above operation, the data may be directly written to the first latch circuit LC1 before activating the memory unit 10. Therefore, as shown in FIGS. 6A to 6M, a write command WT may be supplied without a command ACT being supplied to the command decoder 2. Also in this case, a similar operation to that shown in FIGS. 5A to 5M can be realized.

As described above, with the synchronous-type semiconductor memory device according to the first embodiment of the present invention, the data latch unit 25 for reading and writing data is provided independently of the sense amplifier SA, the first to third latch circuits LC1 to LC3 are connected in parallel with the sense amplifier SA, and the first to third input-output ports IOP1 to IOP3 are provided in correspondence with the first to third latch circuits LC1 to LC3, respectively. Therefore a multiport synchronous-type semiconductor memory device can be readily obtained.

Since the first to third latch circuits LC1 to LC3 can be accessed independently of each other via the first to third input-output ports IOP1 to IOP3, when data read out from the memory cell array CA is selectively transferred to one of the latch circuits, access to latch circuits other than the latch circuit to which the data is being transferred is not blocked. It is thus possible to access latch circuits where transfer of the data is completed even during transfer of other data and, thereby increase data transfer efficiency.

For increased data transfer efficiency, conventional techniques of providing a plurality of banks and accessing the plurality of banks in two ways are devised. A semiconductor memory device employing such a so-called bank system has a problem of a complex circuit of a control system and hence increased circuit scale. On the other hand, by providing a plurality of latch circuits connected in parallel with the sense amplifier SA as described above instead of the banks, high-speed data input and output between the latch circuits and the outside thereof can be realized with a simpler configuration.

Further, data to be written to a memory cell can be stored in the first to the third latch circuit LC1 to LC3 connected in parallel with the sense amplifier SA before the memory cell array CA is activated. Therefore, application of the memory unit 10 can be widened.

Further, the synchronous-type semiconductor memory device according to the first embodiment reads and writes data from and to the memory cell array CA via the latch circuits connected with the input-output ports at all times. Hence, it is possible to access a memory cell from the plurality of ports under the same conditions and, thus realize complex functions.

[Second Embodiment]

Figure 7:
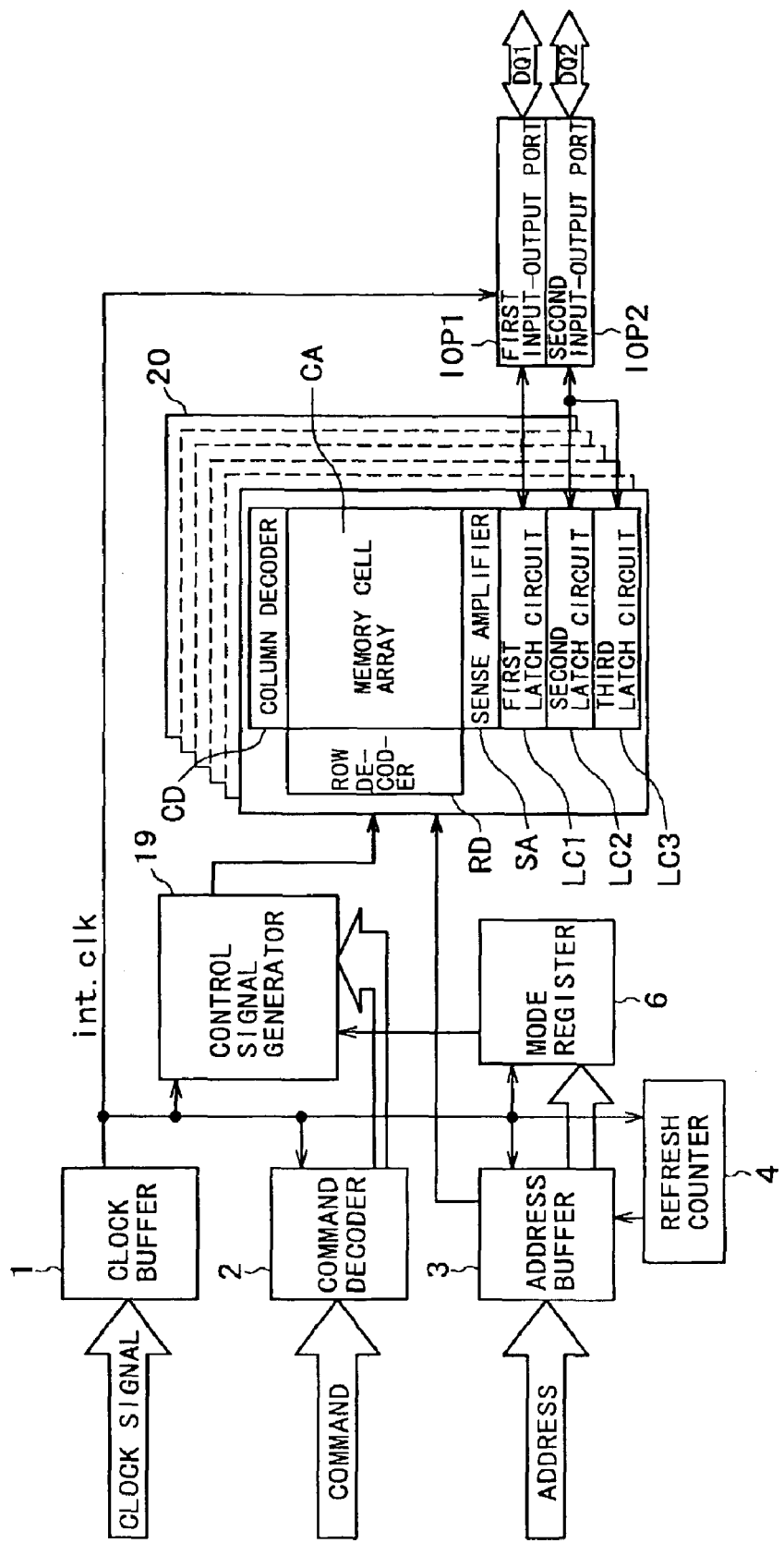
FIG. 7 is a block diagram showing a general configuration of a synchronous-type semiconductor memory device according to a second embodiment of the present invention.

FIG. 7 is a block diagram showing a general configuration of a synchronous-type semiconductor memory device according to a second embodiment of the present invention. As shown in FIG. 7, the synchronous-type semiconductor memory device according to the second embodiment of the present invention has a similar configuration to that of the synchronous-type semiconductor memory device according to the first embodiment shown in FIG. 1. The synchronous-type semiconductor memory device according to the second embodiment of the present invention is different from the synchronous-type semiconductor memory device according to the first embodiment shown in FIG. 1 in that a second input-output port IOP2 is connected to a second latch circuit LC2 and a third latch circuit LC3, and thereby the second input-output port IOP2 is shared by the second latch circuit LC2 and the third latch circuit LC3.

Since the port is shared as described above, a memory unit 20 and a control signal generator 19 are different from the memory unit 10 and the control signal generator 9, respectively, in the first embodiment.

Figure 8:
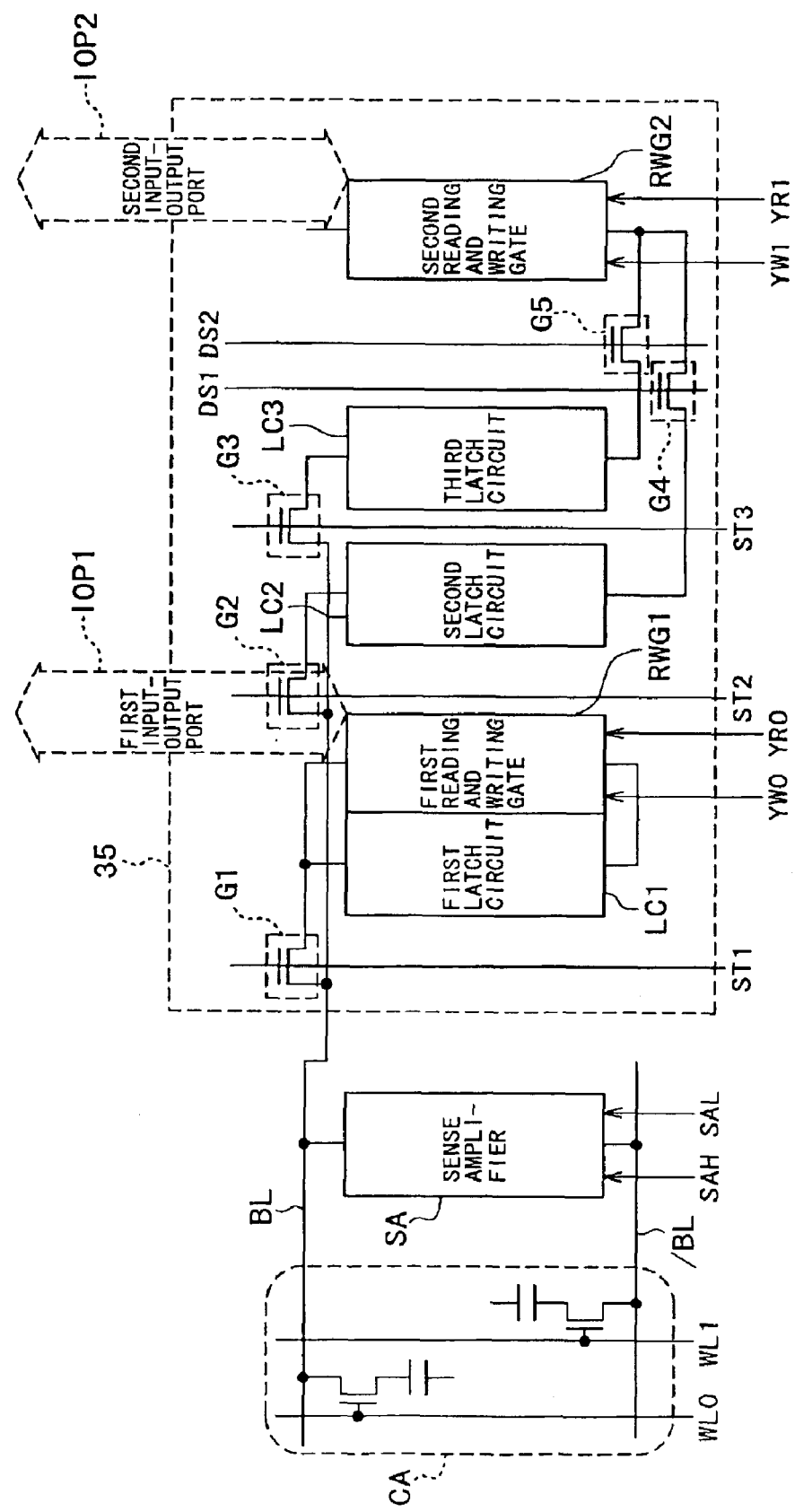
FIG. 8 is a block diagram showing a configuration of a data latch unit included in the synchronous-type semiconductor memory device shown in FIG. 7.

FIG. 8 is a block diagram showing a configuration of a data latch unit 35 included in the synchronous-type semiconductor memory device shown in FIG. 7. As shown in FIG. 8, though the data latch unit 35 according to the second embodiment of the present invention has a similar configuration to that of the data latch unit 25 shown in FIG. 2, a second reading and writing gate RWG2 is connected in series with the second latch circuit LC2 via a gate G4 and connected in series with the third latch circuit LC3 via a gate G5.

The gates G4 and G5 are each formed by an N-channel MOS transistor. A gate of the N-channel MOS transistor forming the gate G4 is supplied with a data selection signal DS1, whereas a gate of the N-channel MOS transistor forming the gate G5 is supplied with a data selection signal DS2. The data selection signals DS1 and DS2 are generated by the control signal generator 19.

In the synchronous-type semiconductor memory device having the above configuration according to the second embodiment, the data selection signal DS1 is activated to a high level to thereby open the gate G4, whereby data are selectively read out from or written to the second latch circuit LC2 via the second reading and writing gate RWG2 and the second input-output port IOP2. Similarly, when the data selection signal DS2 is activated to a high level, the gate G5 is opened, whereby data are selectively read out from or written to the third latch circuit LC3 via the second reading and writing gate RWG2 and the second input-output port IOP2.

As described above, the synchronous-type semiconductor memory device according to the second embodiment of the present invention has a similar configuration to that of the synchronous-type semiconductor memory device according to the foregoing first embodiment, and a reading and writing gate and an input-output port are shared by a plurality of latch circuits. Thus, a multiport synchronous-type semiconductor memory device on a reduced circuit scale can be obtained.

[Third Embodiment]

Figure 9:
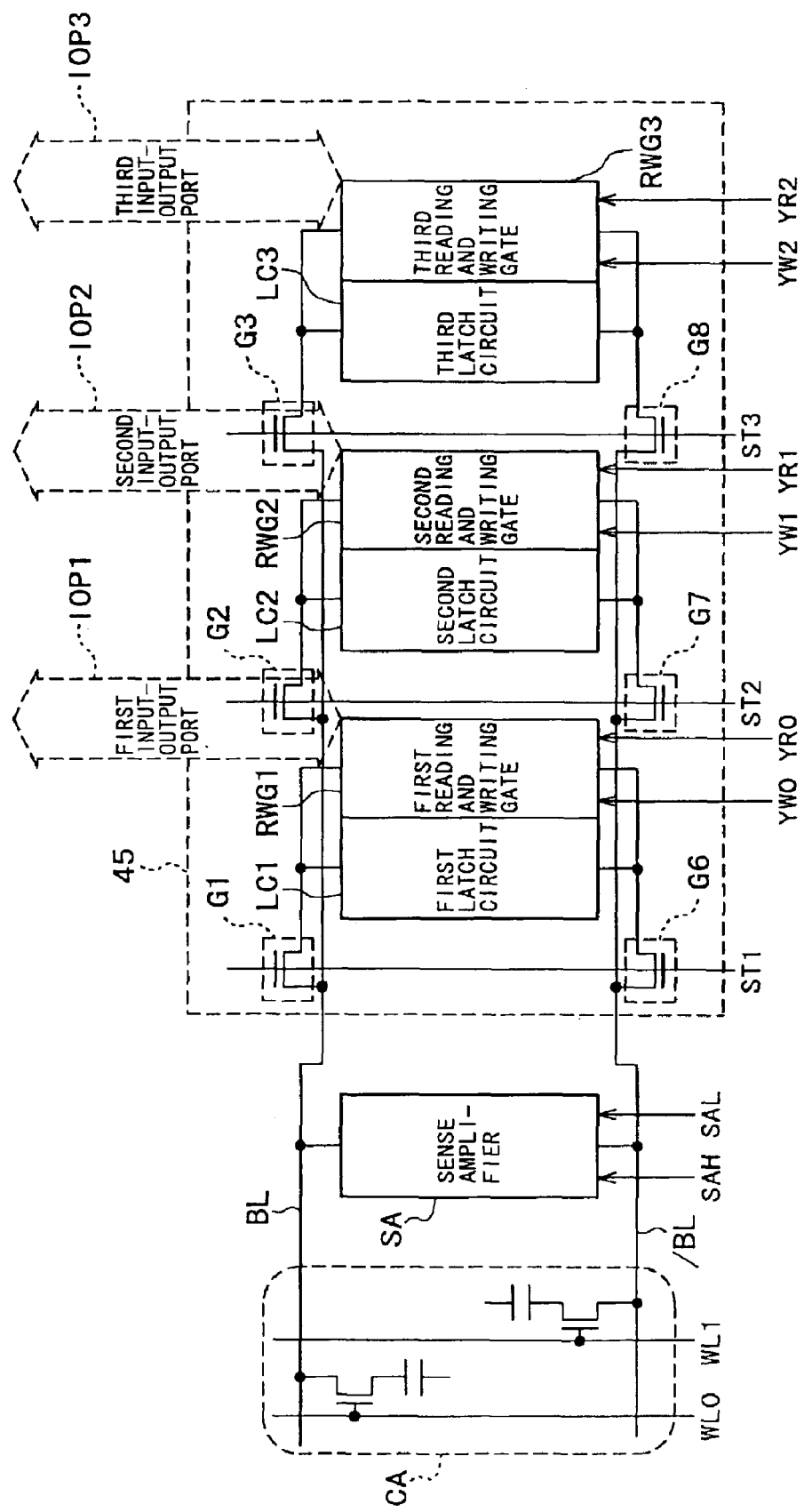
FIG. 9 is a block diagram showing a configuration of a data latch unit according to a third embodiment of the present invention.

FIG. 9 is a block diagram showing a configuration of a data latch unit 45 according to a third embodiment of the present invention. As shown in FIG. 9, though the data latch unit 45 according to the third embodiment has a similar configuration to that of the data latch unit 25 according to the first embodiment shown in FIG. 2, the data latch unit 45 according to the third embodiment is different from the data latch unit 25 according to the first embodiment shown in FIG. 2 in that a first latch circuit LC1 and a first reading and writing gate RWG1 are connected to a sense amplifier SA via a gate G6, a second latch circuit LC2 and a second reading and writing gate RWG2 are connected to the sense amplifier SA via a gate G7, and a third latch circuit LC3 and a third reading and writing gate RWG3 are connected to the sense amplifier SA via a gate G8.

The gates G6 to G8 are each formed by an N-channel MOS transistor. A gate of the N-channel MOS transistor forming the gate G6 is supplied with a transfer signal ST1; a gate of the N-channel MOS transistor forming the gate G7 is supplied with a transfer signal ST2; and a gate of the N-channel MOS transistor forming the gate G8 is supplied with a transfer signal ST3.

The synchronous-type semiconductor memory device, as described above according to the third embodiment of the present invention has similar effects to those of the synchronous-type semiconductor memory device according to the foregoing first embodiment. In addition, since the first to third latch circuits LC1 to LC3 and the first to third reading and writing gates are each connected not only to a bit line BL but also to a complementary bit line/BL, it is possible to write data to the first to third latch circuits LC1 to LC3 more reliably, and read and write data from and to the first to third latch circuits LC1 to LC3 at a higher speed.

[Fourth Embodiment]

Figure 10:
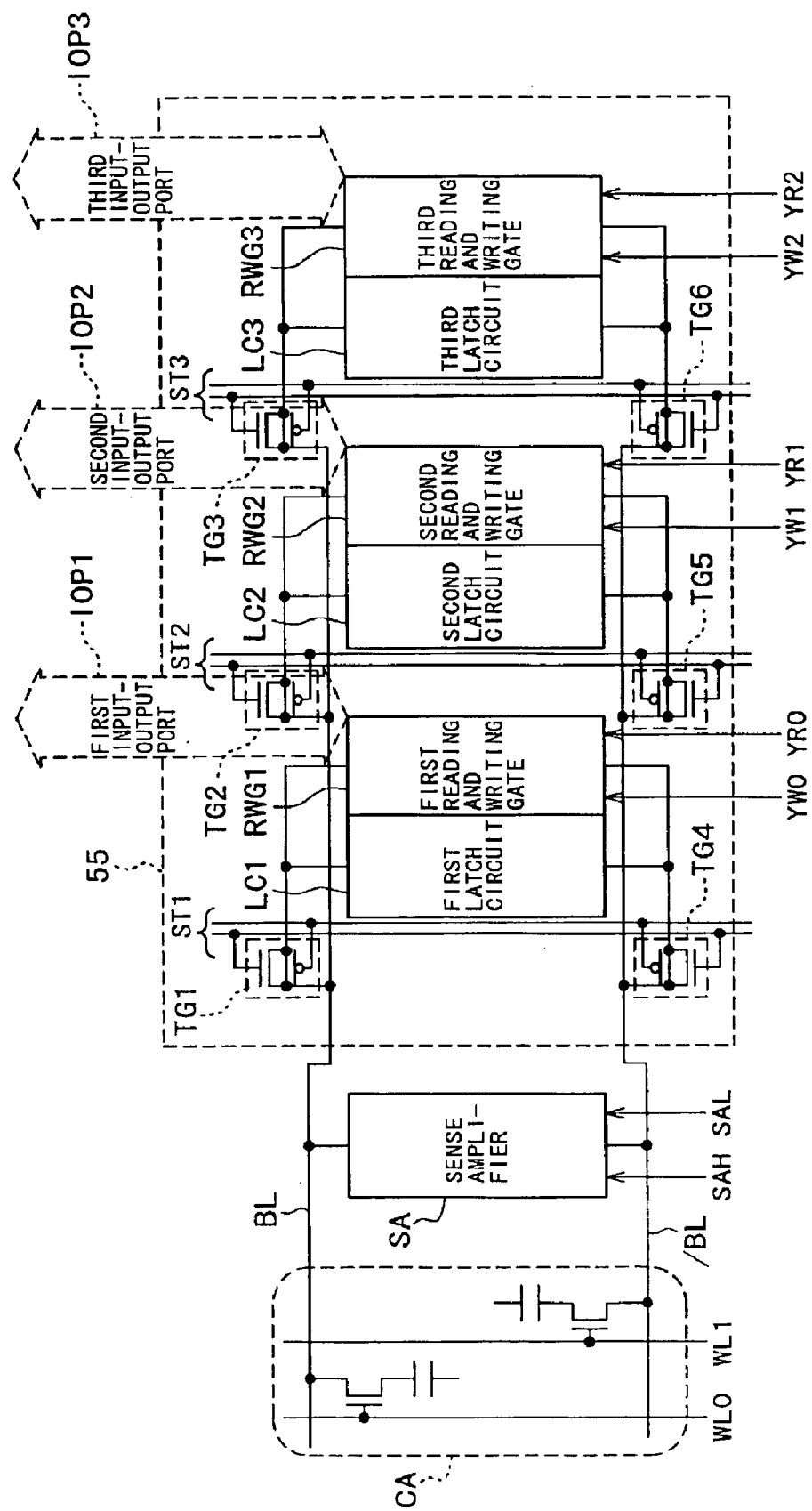
FIG. 10 is a block diagram showing a configuration of a data latch unit according to a fourth embodiment of the present invention.
Figure 11:
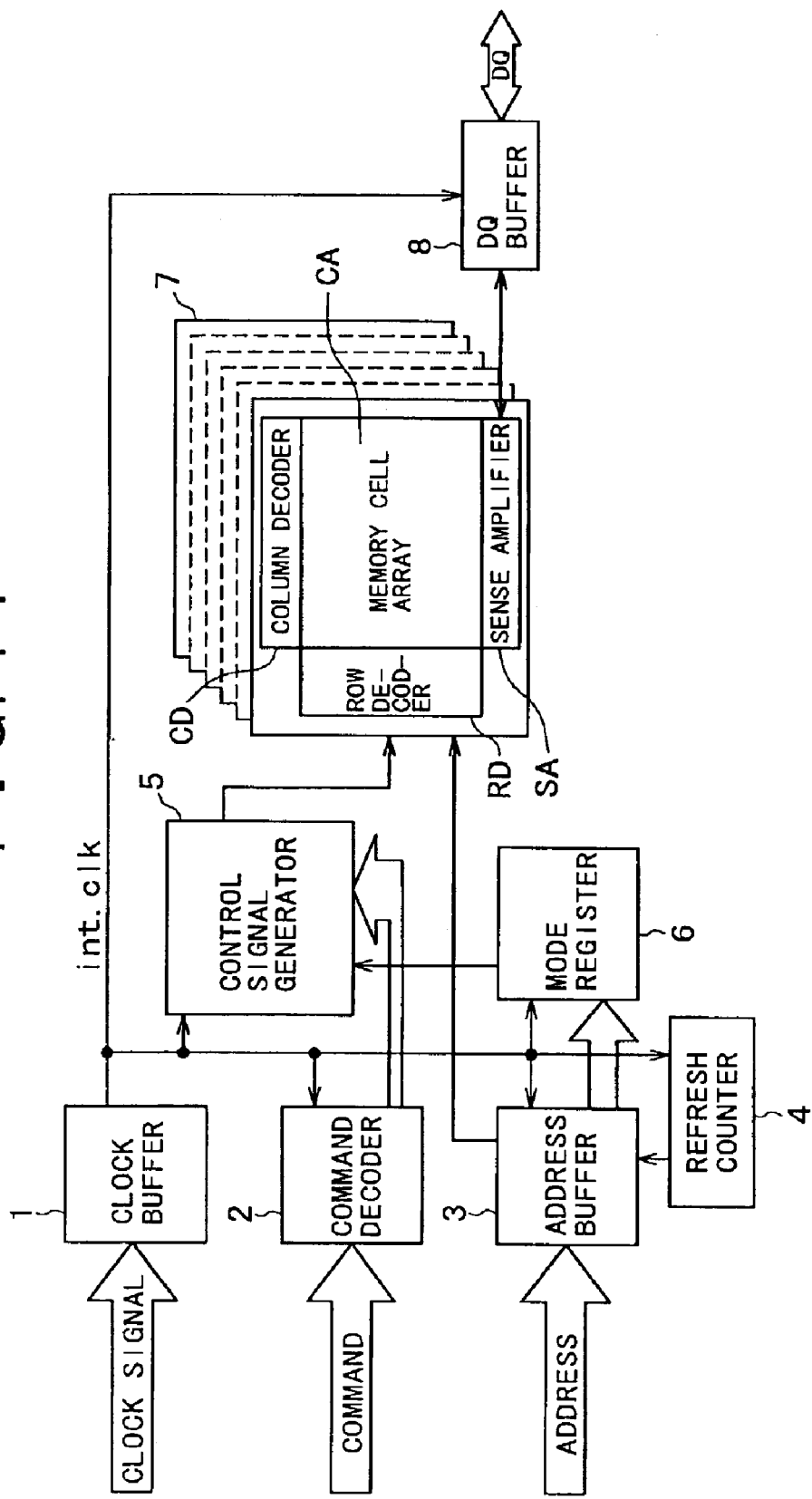
FIG. 11 is a block diagram showing a general configuration of a conventional synchronous-type semiconductor memory device.
Figure 12:
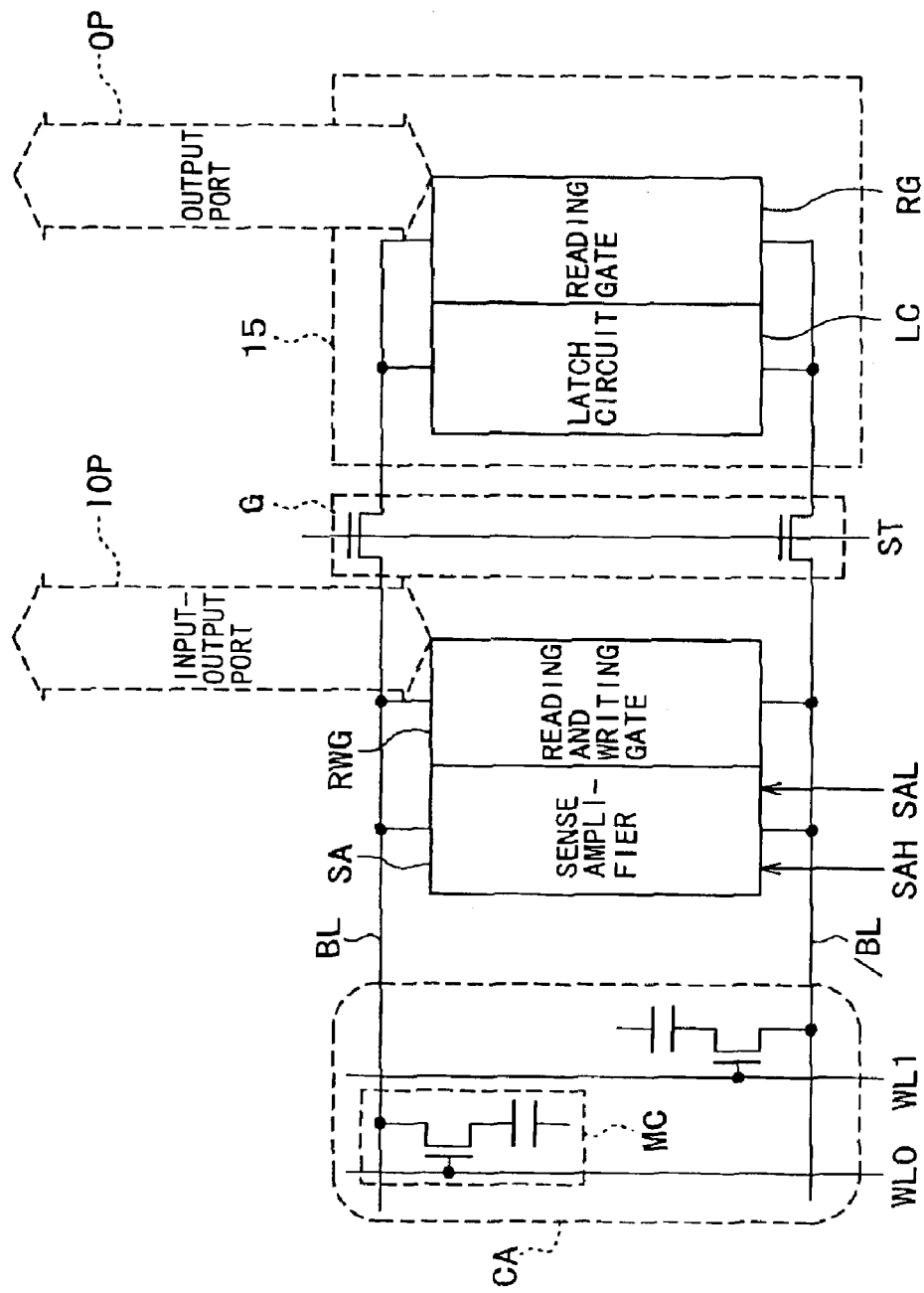
FIG. 12 is a block diagram showing a configuration of a data latch unit included in the synchronous-type semiconductor memory device shown in FIG. 11.

FIG. 10 is a block diagram showing a configuration of a data latch unit 55 according to a fourth embodiment of the present invention. As shown in FIG. 10, though the data latch unit 55 according to the fourth embodiment has a similar configuration to that of the data latch unit 45 according to the third embodiment shown in FIG. 9, the data latch unit 55 according to the fourth embodiment is different from the data latch unit 45 according to the third embodiment shown in FIG. 9 in that a first latch circuit LC1 and a first reading and writing gate RWG1 are connected to a sense amplifier SA via transmission gates TG1 and TG4; a second latch circuit LC2 and a second reading and writing gate RWG2 are connected to the sense amplifier SA via transmission gates TG2 and TG5; and a third latch circuit LC3 and a third reading and writing gate RWG3 are connected to the sense amplifier SA via transmission gates TG3 and TG6.

The transmission gates TG1 to TG6 are each formed by an N-channel MOS transistor and a P-channel MOS transistor connected in parallel with each other. Gates of both the transistors forming the transmission gates TG1 and TG4, respectively, are supplied with a transfer signal ST1; gates of both the transistors forming the transmission gates TG2 and TG5, respectively, are supplied with a transfer signal ST2; and gates of both the transistors forming the transmission gates TG3 and TG6, respectively, are supplied with a transfer signal ST3.

The synchronous-type semiconductor memory device, as described above according to the fourth embodiment of the present invention has similar effects to those of the synchronous-type semiconductor memory device according to the foregoing third embodiment. In addition, since the synchronous-type semiconductor memory device according to the fourth embodiment of the present invention has a configuration obtained by replacing the gates G1 to G3 and G6 to G8 with the transmission gates TG1 to TG6, it is possible to further increase the speed of data transfer between the first to third latch circuits LC1 to LC3 and the sense amplifier SA.

It is to be noted that while in the foregoing embodiments, description has been made of cases where the present invention is applied to synchronous-type semiconductor memory devices, the present invention is not limited to synchronous-type semiconductor memory devices, and is widely applicable to semiconductor memory devices.

With a semiconductor memory device according to the present invention, memory means other than memory means to which data amplified by amplifying means are transferred can be accessed regardless of the operation of the amplifying means. It is therefore possible to increase speed and efficiency of data processing with a simple configuration.

What is claimed is:

1. A semiconductor memory device comprising:
   a memory cell connected to a bit line; a sense amplifier connected to said bit line; a plurality of gates connected to said bit line; a plurality of latch circuits; a plurality of reading and writing gates, and a plurality of input-output ports, wherein during a read operation:
   said sense amplifier amplifies memory data output from said memory cell,
   a first transfer signal controls a first gate of said plurality of gates to transfer said amplified memory data to a first latch circuit of said plurality of latch circuits during a first read-transfer time period, said first gate being operable to electrically disconnect said first latch circuit from said bit line when other than said first read-transfer time period,
   a first read signal controls a first reading and writing gate of said plurality of reading and writing gates to present said amplified memory data from said first latch circuit to a first input-output port of said plurality of input-output ports during a first read-output time period,
   a second transfer signal controls a second gate of said plurality of gates to transfer said amplified memory data to a second latch circuit of said plurality of latch circuits during a second read-transfer time period different than said first read-transfer time period, said second gate being operable to electrically disconnect said second latch circuit from said bit line when other than said second read-transfer time period, and
   a second read signal controls a second reading and writing gate of said plurality of reading and writing gates to present said amplified memory data from said second latch circuit to a second input-output port of said plurality of input-output ports during a second read-output time period different than said first read-output time period.

2. A semiconductor memory device as claimed in claim 1, wherein during a write operation:
   a first write signal controls said first reading and writing gate during a first write-input time period to present first input data from said first input-output port to said first latch circuit, and
   said first transfer signal controls said first gate to transfer said first input data from said first latch circuit to said bit line during a first write-transfer time period, said first gate being operable to electrically disconnect said first latch circuit from said bit line when other than said first write-transfer time period.

3. A semiconductor memory device as claimed in claim 2, wherein a second write signal controls said second reading and writing gate to present second input data from said second input-output port to said second latch circuit and to a third latch circuit of said plurality of latch circuits.

4. A semiconductor memory device as claimed in claim 2, wherein said input data is presented to said first latch circuit before said sense amplifier is activated.

5. A semiconductor memory device as claimed in claim 1, wherein said amplified memory data from a third latch circuit of a plurality of latch circuits is presented to said second input-output port.

6. A semiconductor memory device as claimed in claim 1, further comprising a complementary bit line connected to said memory cell and said sense amplifier.

7. A semiconductor memory device as claimed in claim 1, wherein:
   a third transfer signal controls a third gate of said plurality of gates to transfer said amplified memory data to a third latch circuit of said plurality of latch circuits during a third read-transfer time period different than said first read-transfer time period, said third gate being operable to electrically disconnect said third latch circuit from said bit line when other than said third read-transfer time period,
   a third read signal controls a third reading and writing gate of said plurality of reading and writing gates to present said amplified memory data from said third latch circuit to a third input-output port of said plurality of input-output ports during a third read-output time period different than said first and second read-output time periods.

8. A semiconductor memory device as claimed in claim 1, wherein said first latch circuit stores said memory data when said sense amplifier is activated.

9. A semiconductor memory device as claimed in claim 1, wherein said second latch circuit stores said memory data when said sense amplifier is activated.

10. A semiconductor memory device as claimed in claim 1, wherein said memory cell is dynamic random access memory.

11. A semiconductor memory device as claimed in claim 1, wherein said sense amplifier amplifies said memory data read out from said memory cell.

12. A semiconductor memory device as claimed in claim 1, wherein each of said plurality of gates includes a transmission gate that is formed by connecting an N-channel MOS transistor and a P-channel MOS transistor in parallel with each other.

13. A semiconductor memory device as claimed in claim 1, further comprising:
   a clock buffer that generates an internal clock signal from an external clock signal;
   a command decoder that receives a command;
   an address buffer that receives a row address and a column address;
   a refresh counter that generates an internal address during refresh operation, and supplies said internal address to said address buffer;
   a mode register that is connected to said address buffer; and
   a control signal that generator uses a command from said command decoder to generate an internal control signal.

* * * * *